(12) United States Patent
Boehm et al.

(10) Patent No.: US 8,705,838 B2
(45) Date of Patent: Apr. 22, 2014

(54) METHOD FOR MASK INSPECTION FOR MASK DESIGN AND MASK PRODUCTION

(75) Inventors: Klaus Boehm, Schleifreisen (DE); Christian Kalus, Munich (DE); Thomas Schmoeller, Munich (DE); Wolfgang Harnisch, Lehesten (DE); Axel Zibold, Jena (DE)

(73) Assignees: Carl Zeiss SMS GmbH, Jena (DE); Synopsys, Inc., Mountain View, CA (US)

( * ) Notice: Subject to any disclaimer, the term of this patent is extended or adjusted under 35 U.S.C. 154(b) by 1156 days.

(21) Appl. No.: 11/885,095

(22) PCT Filed: Feb. 4, 2006

(86) PCT No.: PCT/EP2006/001000
§ 371 (c)(1),
(2), (4) Date: Apr. 16, 2008

(87) PCT Pub. No.: WO2006/089630
PCT Pub. Date: Aug. 31, 2006

(65) Prior Publication Data
US 2008/0247632 A1   Oct. 9, 2008

(30) Foreign Application Priority Data
Feb. 25, 2005   (DE) .......................... 10 2005 009 536

(51) Int. Cl.
*G06K 9/00*   (2006.01)
(52) U.S. Cl.
USPC ....................................................... 382/144
(58) Field of Classification Search
USPC ....................................................... 382/144
See application file for complete search history.

(56) References Cited

U.S. PATENT DOCUMENTS

| 5,795,688 A | 8/1998 | Burdorf et al. |
| 6,268,093 B1 | 7/2001 | Kenan et al. |

(Continued)

FOREIGN PATENT DOCUMENTS

| EP | 1 093 017 A2 | 4/2001 |
| EP | 1 560 073 A2 | 8/2005 |

(Continued)

OTHER PUBLICATIONS

Axel M. Zibold, et al., "Using the aerial image measurement technique to speed up mask development for 193nm immersion and polarization lithography," Advanced Microlithography Technologies, *Proc. of SPIE*, vol. 5645, pp. 223-232 (2005).

*Primary Examiner* — Tarifur Chowdhury
*Assistant Examiner* — Jonathan Hansen
(74) *Attorney, Agent, or Firm* — Fish & Richardson P.C.

(57) ABSTRACT

The invention relates to a mask inspection method that can be used for the design and production of masks, in order to detect relevant weak points early on and to correct the same. According to said method for mask inspection, an aerial image simulation, preferably an all-over aerial image simulation, is carried out on the basis of the mask design converted into a mask layout, in order to determine a list of hot spots. The mask/test mask is analysed by means of an AIMS tool, whereby real aerial images are produced and compared with the simulated aerial images. The determined differences between the aerial images are used to improve the mask design. The inventive arrangement enables a method to be carried out for mask inspection for mask design and mask production. The use of the AIMS tool directly in the mask production process essentially accelerates the mask production, while reducing the error rate and cost.

18 Claims, 1 Drawing Sheet

(56) References Cited

U.S. PATENT DOCUMENTS

| | | |
|---|---|---|
| 6,768,958 B2 | 7/2004 | Ivanovic et al. |
| 2002/0127479 A1 | 9/2002 | Pierrat |
| 2004/0243320 A1 | 12/2004 | Chang et al. |
| 2005/0213807 A1* | 9/2005 | Wasserman .................. 382/152 |

FOREIGN PATENT DOCUMENTS

| | | |
|---|---|---|
| WO | WO 00/60415 | 10/2000 |
| WO | WO 2004/008244 A2 | 1/2004 |

\* cited by examiner

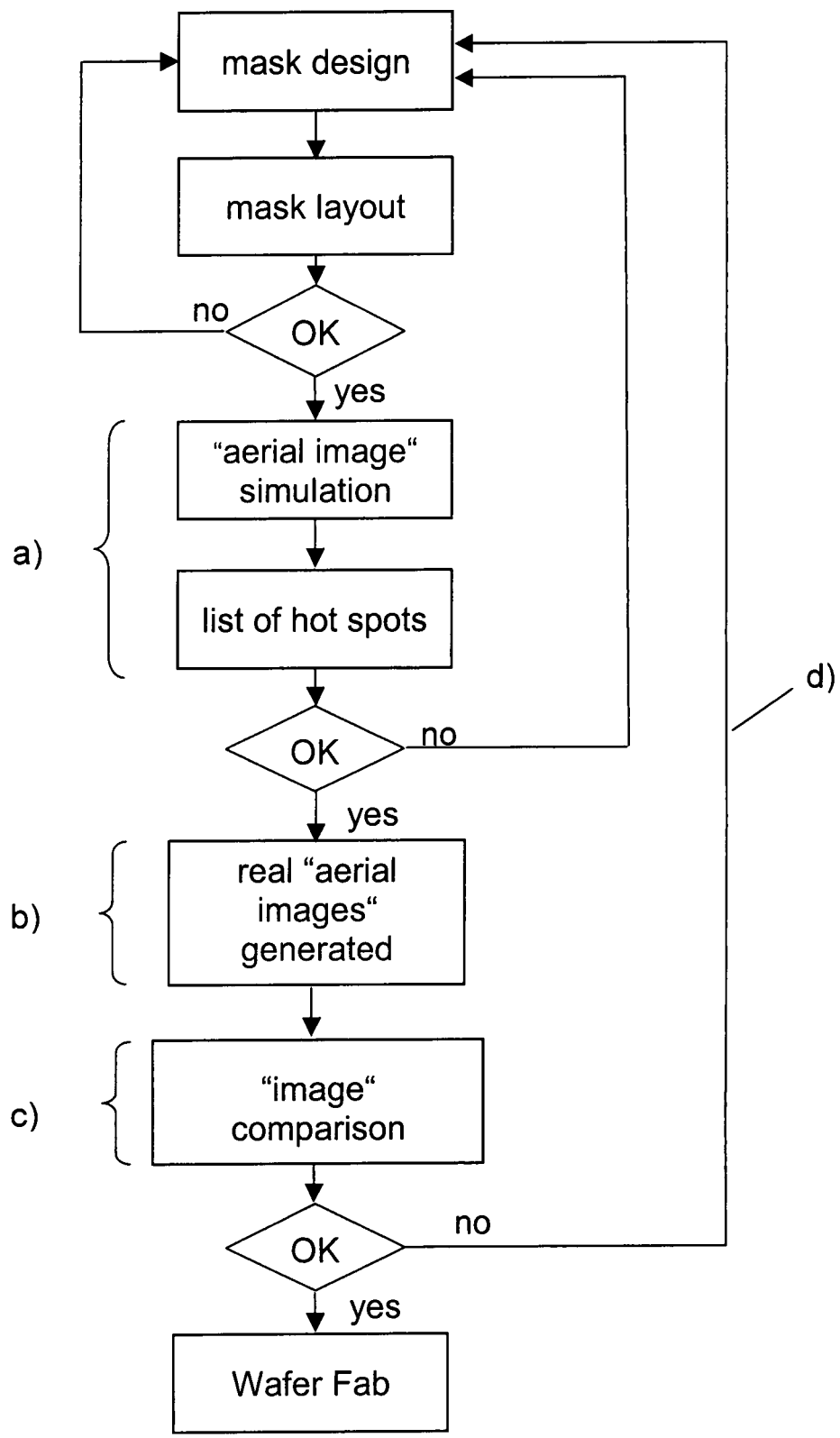

METHOD FOR MASK INSPECTION FOR MASK DESIGN AND MASK PRODUCTION

FIELD OF THE INVENTION

The present invention relates to a method for mask inspection, which method can be employed in connection with mask design and mask production in order to be able to recognize and correct relevant flaws early on.

Background of the Invention

Ever-decreasing object structure sizes on the wafer are placing ever-increasing requirements on mask design and mask production. Since the image generated by the mask is imaged on the wafer at a reduced size, flaws on the mask (so-called hot spots) have a particularly strong effect. Moreover, the presently used structural sizes of the critical masks are in the range of the resolution limit of the wafer exposure systems, so that the so-called hot spots are becoming increasingly dominant. The analysis of defects in the mask producing process and particularly in the process of mask design is becoming more and more important due to the decreasing size of structures.

The AIMS™ (Aerial Imaging Measurement System) of Carl Zeiss SMS GmbH has been established in the market for 10 years for analyzing mask defects in terms of printability. It involves illuminating and imaging a small area of the mask (location of a defect and its vicinity) under the same conditions of illumination and imaging (wavelength, NA, type of illumination, degree of coherence of light (Sigma)) as in lithographic scanners. However, in contrast to the scanner, the aerial image generated by the mask is magnified onto a CCD camera. The camera sees the same latent image as the resist on the wafer. Thus, the aerial image can be analyzed without expensive test prints by wafer exposure devices and conclusions can be drawn as to the printability of the mask. Additional information for analysis of the lithographic process window is obtained by recording a focus sequence.

According to the known prior art, the mask layout and the production of the lithographic mask are effected after the mask design. The lithographic mask is then inspected for errors by an inspection unit, which errors are then corrected by a repair unit. Usually, not all errors can be detected. Any errors not detected by the inspection unit are then not detected until exposure of the wafers and lead to a high rate of error in production. In addition to the delay in production resulting therefrom, mask repair or the purchase of a new mask lead to considerable extra costs, which may still increase considerably further due to costs resulting from the delay in production.

WO 00/60415 A1 describes a method for correction of imaging errors, wherein a change in an electronic mask layout after exposure of said mask layout causes structures to be imaged on the mask by a mask writer which come as close as possible to the original mask layout or to the desired mask. The process conditions to be taken into consideration are summarized in the form of tables which include, in particular, the parameters that are dependent on the process conditions in the form of correction values. For example, the tables contain position-dependently differing correction values for compensation of the device-dependent aberration of the mask writer. The solution presupposes for all correction values physics-based models of the corresponding imaging errors. Although the proposed method, in contrast to known methods, enables effective correction of mask structures for generating highly integrated circuits, the required amount of computation is considerable. A further disadvantage of this method is the multitude of parameters to be considered in the form of correction values. This includes taking into account not only effects of diffraction and refraction, but also interactions and device-dependent aberration effects.

The methods known in the prior art do not ensure that the inspection machine used recognizes all errors. For instance, it may happen that errors on the mask are not recognized until production at the wafer factory. This generates additional costs for mask repair or purchase of a new mask and also leads to a delay in production and to further consequential costs.

Summary of the invention

The present invention improves the solutions known from the prior art such that errors can be recognized and removed already during mask layout and mask design so that the masks produced have a lower error rate and costs are minimized.

The method for mask inspection in connection with mask design and mask production comprises effecting an "aerial image" simulation of the mask design which has been designed and converted to a mask layout, from which simulation a list of critical locations (hot spots) is determined. The mask/test mask is analyzed with the aid of an AIMS tool by generating real "aerial images" and comparing them with the simulated "aerial images". In doing so, the two "aerial images" are correlated with one another in a structurally precise manner and evaluated at the same location with respect to the line width or the size of the so-called process window.

Either the determined differences in the results or the real "aerial image" result itself are used to improve the mask design.

The determined differences in the results of the "aerial images" serve to improve the design, and the quality of the mask can be improved by passing it through the aforementioned process steps several times.

The use of the AIMS tool directly in the mask producing process enables a considerable acceleration of mask production while reducing the error rate and saving costs. With respect to the masks, which will become more and more expensive in the future due to increasing complexity, relevant flaws can be recognized at an early stage in the mask production process before errors occur in the production of electronic components.

BRIEF DESCRIPTION OF THE DRAWING

The solution according to the invention will be described in the following by way of an exemplary embodiment. In the drawing, FIG. 1 shows a flow scheme of the individual method steps.

DETAILED DESCRIPTION OF THE DRAWING

The method for mask inspection in connection with mask design and mask production comprises effecting an "aerial image" simulation, preferably a full-surface "aerial image" simulation, of the mask design after it has been designed and converted to a mask layout, from which simulation a list of critical locations (hot spots) is determined. The mask/test mask is analyzed with the aid of an AIMS tool on the basis of these hot spots, by generating real "aerial images" and comparing them with the simulated "aerial images". The differences thus determined for the "aerial images" are used to improve the mask design.

When converting the mask design into a corresponding mask layout, so-called RETs (Resolution Enhancement Techniques) can be applied, such as the OPC (Optical Proximity Correction) technique, for example. The OPC technique involves a modification of the original structures of the design data set such that "structure smearing" by the diffraction of light is largely compensated. A square structure in the mask would be imaged as a circle in the resist due to the diffraction of light at the mask and due to imaging errors of the lens system. Using the OPC technique, the corners of the square in the mask are "bulged", which minimizes the rounding of the resist image. With the OPC technique, the structures on the mask are changed such that the desired structure is formed on the chip only due to the diffraction effects. Instead of simple polygons, complex geometric structures have to be generated, which cause a dramatic increase in data volumes. Imaging errors are compensated by pre-calculated "counter-errors" in the mask.

In this connection, FIG. 1 shows a flow scheme of the individual method steps, wherein a draft mask design is converted to the corresponding mask layout. Critical locations may lead to changes in the mask layout already during the stage of conversion to the mask layout. According to method step a), an "aerial image" simulation of the finished mask layout is effected to thereby determine a list of critical locations (hot spot list).

The list of critical locations (hot spots) is determined by analysis of the simulated "aerial images", e.g. by varying the illumination conditions, the conditions of mask production and/or the stepper conditions. Determination and variation of the process window is possible by changing the illumination dosage or by defocusing, respectively. Modifiable conditions in mask production include, for example, etching depth, mask bias and mask corner rounding. Stepper conditions are, for example, numerical aperture, types of illumination, degree of coherence, and polarization.

The list of critical locations is minimized by iterative improvements in design with a subsequent new, full-surface "aerial image" simulation. In this case, analysis is effected by full-surface verification of the mask layout, by generating full-surface "aerial image" simulations of the mask, thereby generating the structural image that will later be employed on the electronic component. Based on an analysis of the simulated aerial images in relation to the desired design, or after pre-selection by an engineer in an overview of the simulation, a list of sites, called hot spots, is generated on the mask, whose aerial image or critical line width allows anticipation of errors in mask production.

For example, the hot spot list is minimized by optimizing the conditions of lithography (such as NA, coherence and aperture). When applying the OPC technique, it is also possible to minimize the hot spot list by global and/or local correction of the OPC structures. Thus, for example, all corners included in the mask design that are the same size can be corrected (globally) at the same time, with the same modifications.

The hot spot list can also be determined by analysis of the layout with respect to tightly packed sites and minimal structures or even by a "die-to-die" comparison of repetitive sites.

All critical locations are checked for the capacity to improve the design and the hot spot list is minimized by iterative improvement in design with subsequent new, full-surface "aerial image" simulation.

For iterative improvement in design, the image is upwardly correlated locally in the scanner by coherent or partially coherent light, i.e. a change in one local site has effects on other local sites. If a global modification is effected, said modification will affect the entire layout. This means that, strictly speaking, the layout has to be optimized globally. For practical reasons, a limitation is made to few points, and the method is repeated until convergence, i.e. a stable state, is achieved. It is to be expected that an iterative modification may cause local points outside the optimized area to deteriorate.

If a minimized hot spot list is present, a mask is produced in the form of a test mask or a full-field mask, based on the mask layout. On the basis of the hot spot list and under stepper/scanner conditions, this mask is analyzed in combination with various mode types, using an AIMS tool whereby real "aerial images" are generated. This corresponds to method step b) according to FIG. 1. Subsequently, the real and the simulated "aerial images" are compared in method step c) and differences are determined.

However, the comparison between the simulated and the real aerial images cannot be effected until the system has been calibrated using test structures. The test structures of use are one-dimensional or two-dimensional grids, whose structure is at least parallel to one of the two principal axes. In addition to these grid structures, square structures, such as hole grids, whose square holes are imaged with a round shape, can also be used.

The comparison between the two images is effected by using a simple threshold value model. Using a uniform, one-dimensional grid as the test structure and determining a threshold value in the sinusoidal intensity distribution obtained by imaging, the points of intersection of a peak represent the resolvable structural width at this threshold value. The higher the threshold value, the lower the structural width will become. Using a two-dimensional test structure, a full-surface intensity distribution with assumed contour lines of the mask layout in both images will be obtained. If the difference in structural width in both images is greater than a predetermined tolerance, such site (area) is marked as defective.

These differences, which manifest themselves in different line widths, surface dimensions or process window dimensions, are used for an improved design.

In contrast to the aerial image simulation, the AIMS image contains the real distortion of the mask by the non-ideal mask-writing process. These real distortions may be caused by distortions of the mask itself (e-beam proximity effect) and/or by insufficient optical correction. Since some of these effects run counter to each other and, thus, have to be corrected separately, it is required to determine which of these effects is responsible for the real distortions.

For this purpose, line widths and/or edge shifts are simulated for mask writing at certain (critical) points of measurement, which requires knowledge of the mask technology. Subsequently, optical exposure is simulated at the same points, which requires knowledge of the lithographic conditions.

For both steps, deviations are documented as a function of the point of measurement. Said deviations result in characteristic signatures $\sigma_m$ for mask lithography and $\sigma_0$ for optical lithography.

Next, the signatures are compared with the signature $\sigma_b$ of the observed values of measurement by determining the correlation coefficients $\rho_{mb}$ with respect to the mask and $\rho_{ob}$ with respect to the optics.

The correlation coefficients provide a measure (in the form of a mathematical probability) for the influence which mask exposure or optical exposure, respectively, has on the actual observation. In this connection, the precision of the statement can be increased by measuring at different points in the layout, which is done in practice anyway. Each pair of values then results in a row within a correlation matrix. The correlation matrix allows determination of the total correlation coefficients for the mask and for the optics with greater precision.

If this reveals that the real distortions result from the mask itself (e-beam proximity effect), the mask has to be corrected accordingly. If, in contrast thereto, the real distortions result from optically induced effects (optical proximity correction), the hot spot list has to be minimized as described above.

If these differences correspond to predetermined limits, the quality of the mask layout is sufficient, and the mask can be supplied to the wafer fabrication. Multiple cycles through the individual process steps will improve the quality of the mask layout accordingly.

Together with the assembly according to the invention, a method for mask inspection in connection with mask design and mask production is provided, thereby producing considerable leap in the quality of the mask design. The possibility of early verification of the suitability of masks for mass production allows to allows considerable acceleration of mask production, while reducing cost. Early recognition of relevant flaws in the mask production process is of growing importance, in particular with respect to the increasingly expensive masks.

The invention claimed is:

1. A method for mask inspection in connection with mask design and/or mask production, with respect to the mask design that has been drafted and converted into a mask layout, wherein at least one optical proximity correction has been applied during conversion of the mask design into a mask, comprising:
   (a) simulating an aerial image to determine a list of critical locations known as hot spots;
   (b) utilizing the hot spots to analyze the mask and/or the test mask with the help of an Aerial Imaging Measurement System tool, by generating real aerial images;
   (c) comparing the real aerial images with the simulated aerial images; and
   (d) utilizing the differences determined for the real aerial images and the simulated aerial images and determining whether real distortions contained in the aerial image are caused by the electron beam proximity effect or by insufficient optical proximity corrections so as to improve the design of the mask, comprising the following steps:
   simulating line widths and/or edge shifts for mask writing at certain critical points of measurement, and simulating optical exposure at the same points;
   determining characteristic signatures $\sigma_m$ for mask lithography and $\sigma_o$ for optical lithography from deviations documented for both simulations as a function of measurement point; and
   comparing the signatures $\sigma_m$ and $\sigma_o$ with the signature $\sigma_b$ of the observed values of measurement by determining correlation coefficients $\rho_{mb}$ with respect to the mask and $\rho_{ob}$ with respect to the optics, the correlation coefficients providing a measure for the influence which mask exposure or optical exposure, respectively, has on the actual observation.

2. The method as claimed in claim 1, wherein in method step
   (a) the aerial image simulation for determining the list of critical locations, such as hot spots, comprises a full-surface aerial image simulation.

3. The method as claimed in claim 1, wherein method step
   (a) comprises minimizing the list of critical locations by iterative improvements in design with a subsequent, renewed full-surface aerial image simulation.

4. The method as claimed in claim 1, wherein method step
   (a) comprises determining the list of critical locations by an analysis of the simulated aerial images by varying illumination conditions, conditions of mask production and/or stepper conditions, by an analysis of layout with respect to tightly packed spots and minimal structures or by a die-to-die comparison of repetitive spots.

5. The method as claimed in claim 1, wherein in method step
   (b) the mask produced by method step (b) comprises a test mask or a full-field mask.

6. The method as claimed in claim 1, wherein method step
   (d) further comprises utilizing correlation matrices whose correlation coefficients $\rho_{mb}$ are determined by comparing characteristic signatures $\sigma_m$ for mask lithography and $\sigma_o$ for optical lithography with observed values of measurement $\sigma_b$ to determine the causes of differences between the real aerial images and the simulated aerial images.

7. The method as claimed in claim 1, further comprising performing multiple cycles of method steps (a) to (d) to improve quality of the mask.

8. The method as claimed in claim 1, further comprising utilizing resolution enhancement techniques to convert the mask design into a mask layout.

9. The method as claimed in claim 8, wherein the resolution enhancement techniques comprise an optical proximity correction technique.

10. A method for inspection of a mask design, wherein at least one optical proximity correction has been applied during conversion of the mask design into a mask, comprising:
    generating a simulated aerial image of the mask design which has been designed and converted to a mask layout;
    determining a list of critical locations from the mask layout;
    generating real aerial images of the mask design; and
    analyzing the mask design by comparing the real aerial images with the simulated aerial images and determine whether real distortions contained in the aerial image are caused by the electron beam proximity effect or by insufficient optical proximity corrections based on differences in the real aerial images and the simulated aerial images;
    wherein the analyzing comprises:
    simulating line widths and/or edge shifts for mask writing at certain critical points of measurement, and simulating optical exposure at the same points;
    determining characteristic signatures $\sigma_m$ for mask lithography and $\sigma_o$ for optical lithography from deviations documented for both simulations as a function of measurement point; and
    comparing the signatures $\sigma_m$ and $\sigma_o$ with the signature $\sigma_b$ of the observed values of measurement by determining correlation coefficients $\sigma_{mb}$ with respect to the mask and $\sigma_{ob}$ with respect to the optics, the correlation coefficients providing a measure for the influence which mask exposure or optical exposure, respectively, has on the actual observation.

11. The method as claimed in claim 10, further comprising correlating the real aerial images with the simulated aerial images in a structurally precise manner at the critical locations with respect to line width or size of a process window.

12. The method as claimed in claim 10, wherein the simulated aerial image comprises a full surface simulated aerial image.

13. The method as claimed in claim 10, further comprising minimizing the list of critical locations by iterative improvements in design with a subsequent, renewed full-surface aerial image simulation.

14. The method as claimed in claim 10, further comprising determining the list of critical locations by an analysis of the simulated aerial images by varying illumination conditions, conditions of mask production and/or stepper conditions, by an analysis of layout with respect to tightly packed spots and minimal structures or by a die-to-die comparison of repetitive spots.

15. The method as claimed in claim 10, further comprising utilizing correlation matrices whose correlation coefficients $\rho_{mb}$ are determined by comparing characteristic signatures $\sigma_m$ for mask lithography and $\sigma_o$ for optical lithography with observed values of measurement $\sigma_b$ to determine causes of real differences between the simulated aerial images and the real aerial images.

16. The method as claimed in claim 10, further comprising iteratively repeating the method as recited in claim 10 to improve the quality of the mask.

17. The method as claimed in claim 10, further comprising utilizing resolution enhancement techniques to convert the mask design into a mask layout.

18. The method as claimed in claim 17, wherein the resolution enhancement techniques comprise an optical proximity correction technique.

* * * * *